United States Patent [19]
Owens et al.

[11] Patent Number: 5,661,069
[45] Date of Patent: Aug. 26, 1997

[54] METHOD OF FORMING AN MOS-TYPE INTEGRATED CIRCUIT STRUCTURE WITH A DIODE FORMED IN THE SUBSTRATE UNDER A POLYSILICON GATE ELECTRODE TO CONSERVE SPACE

[75] Inventors: Alexander H. Owens, Los Gatos; Shahin Toutounchi, Pleasanton, both of Calif.

[73] Assignee: LSI Logic Corporation, Milpitas, Calif.

[21] Appl. No.: 475,028

[22] Filed: Jun. 6, 1995

[51] Int. Cl.⁶ .................................................. H01L 21/70
[52] U.S. Cl. .................................................. 438/237
[58] Field of Search .............................. 437/47, 60, 904, 437/51

[56] References Cited

U.S. PATENT DOCUMENTS

| | | | |
|---|---|---|---|
| 4,605,447 | 8/1986 | Brotherton et al. | 148/1.5 |
| 4,732,869 | 3/1988 | van Attekum et al. | 437/34 |
| 4,742,015 | 5/1988 | Ohagen | 437/904 |
| 4,916,082 | 4/1990 | Lesk et al. | 437/20 |
| 5,009,720 | 4/1991 | Hokuyo et al. | 136/255 |
| 5,087,582 | 2/1992 | Campbell et al. | 437/41 |
| 5,114,529 | 5/1992 | Masuyama et al. | 156/643 |
| 5,175,118 | 12/1992 | Yoneda | 437/40 |
| 5,309,841 | 5/1994 | Hartman et al. | 102/202.4 |
| 5,315,145 | 5/1994 | Lukaszek | 257/379 |
| 5,336,924 | 8/1994 | Quint | 257/603 |
| 5,366,908 | 11/1994 | Pelella | 437/904 |

OTHER PUBLICATIONS

Shin, Hyungcheol, et al., "Impact of Plasma Charging Damage and Diode Protection on Scaled Thin Oxide", *IEDM*, 1993, pp. 467–470.

*Primary Examiner*—Tuan H. Nguyen
*Attorney, Agent, or Firm*—John P. Taylor

[57] ABSTRACT

An improved MOS-type integrated circuit structure, and a method of making same, are described wherein a diode is electrically connected between the polysilicon gate electrode and the semiconductor substrate, and physically located in the substrate below the contact area of the polysilicon gate electrode so that no extra lateral space is needed to provide such a diode connection between the polysilicon gate electrode and the substrate. The junction is formed in the substrate in a region where the contact area of the gate electrode is usually positioned over field oxide. An opening is provided for the diode in the field oxide region of the substrate, by masking off an additional portion of the substrate, when the field oxide is initially grown, to provide for location of the diode therein.

1 Claim, 5 Drawing Sheets

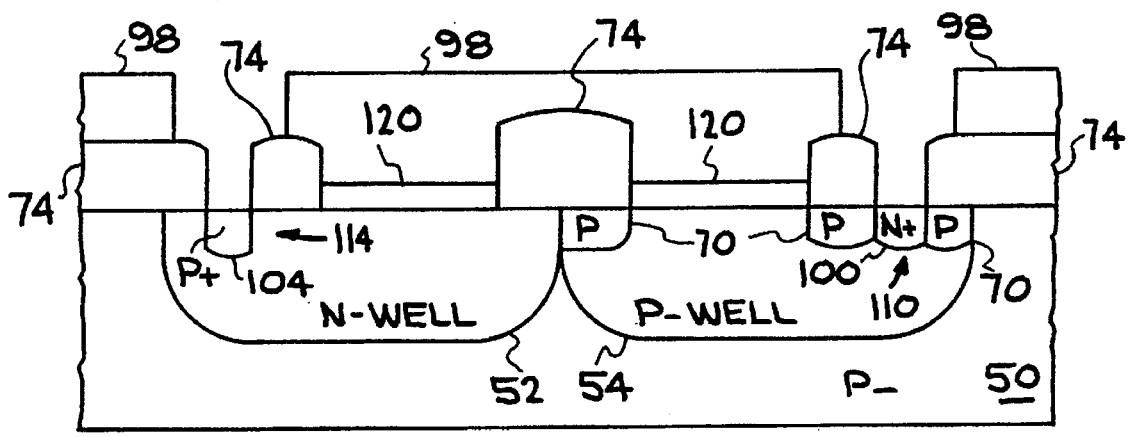

FIG. 12

MASKING A SEMICONDUCTOR SUBSTRATE TO PROVIDE A FIRST OPENING TO THE SUBSTRATE IN SUBSEQUENTLY GROWN FIELD OXIDE TO FORM AN MOS DEVICE AND A SECOND, SPACED APART, OPENING IN THE FIELD OXIDE TO FORM A DIODE

FORMING A DIODE IN THE AREA OF THE SEMICONDUCTOR SUBSTRATE DEFINED BY THE SECOND OPENING IN THE FIELD OXIDE MASK SPACED FROM THE MOS DEVICE FORMED IN THE AREA OF THE SUBSTRATE DEFINED BY THE FIRST OPENING IN THE MASK

THEN FORMING A POLYSILICON GATE ELECTRODE AS A PART OF THE MOS DEVICE WITH A CONTACT PORTION OF THE GATE ELECTRODE FORMED OVER THE DIODE AND IN ELECTRICAL CONTACT WITH THE DIODE

FIG. 13

METHOD OF FORMING AN MOS-TYPE INTEGRATED CIRCUIT STRUCTURE WITH A DIODE FORMED IN THE SUBSTRATE UNDER A POLYSILICON GATE ELECTRODE TO CONSERVE SPACE

BACKGROUND OF THE INVENTION

1. Field of the Invention

This invention relates to an MOS-type integrated circuit structure, and a method of making same, wherein one or more diodes are formed in a semiconductor substrate beneath the polysilicon gate electrode of an MOS-type integrated circuit structure. The one or more diodes are provided to reduce plasma damage to and charging of the gate oxide, thus improving the overall reliability of the product. The location of the one or more diodes beneath the polysilicon gate electrode serves to conserve space on the substrate, and thus, reduces the cost of the product.

2. Description of the Related Art

Advances in MOS technology, including reduction in scale, have resulted in the reduction of the gate oxide thickness to thinner and thinner values. This reduction in gate oxide thicknesses and the increased use of plasma technology, particularly starting at the first interconnect level, has generated increasing demands on a thinner dielectric. More specifically, plasma processing has been demonstrated to cause damage to the quality of the gate oxide. This damage occurs because high frequency RF signals are applied to the structure, including the gate oxide, during many steps in the process of forming an MOS-type integrated circuit structure. Examples of plasma steps which can result in exposure of the gate oxide to such high frequency RF signals include, for example, plasma stripping of photoresist, pre-metal deposition sputter etching, etchback of tungsten used to fill vias and contact openings, and patterning of metallization layers by etching.

The high frequency RF signals generated during such processing induce AC currents which pass through the gate oxide leaving small mounts of charge trapped in the oxide with each pass of the field. Such processing then reduces the overall reliability of the oxide, thereby increasing the possibility of failure of the integrated circuit structure during use.

It has been proposed to reduce such damage to the gate oxide by AC currents induced by the high frequency RF signals from plasma processing, using a diode electrically connected between the gate electrode and the substrate. This is illustrated schematically in prior art FIGS. 1A and 1B, which respectfully show the use of such protective diodes in an N channel structure (FIG. 1A) and a P channel structure (FIG. 1B). In FIG. 1A, the gate oxide in N channel MOS structure 2, which may be formed in a P well, is protected by electrically connecting gate electrode 4 to one electrode of a reverse biased diode 6 having its other electrode electrically coupled to the P well. Similarly, as illustrated in FIG. 1B, the gate oxide in P channel MOS structure 12, which may be formed in a N well, is protected by electrically connecting gate electrode 14 to one electrode of a reverse biased diode 16 having its other electrode electrically coupled to the N well. Such use of diode protection devices to inhibit plasma charging damage to gate oxide is discussed by Shin, Ma, and Hu in an article entitled "Impact of Plasma Charging Damage and Diode Protection on Scaled Thin Oxide", published in IDEM 93 at pages 467–470.

While the use of such a diode or diodes will, from an electrical standpoint, operate to reduce or eliminate the problem of gate oxide charging and/or degradation, its physical implementation has resulted in geographical problems with regard to the location of the diode on the semiconductor substrate. Since the problem was created by the desire to further reduce the scale of devices and interconnects on the substrate, the need to, in turn, provide an additional diode for each MOS device, and to provide the geographical space laterally on the substrate for such a diode is self-defeating of the scaling down of the structure.

Prior art FIG. 2 illustrates this space problem. In FIG. 2, the MOS devices are respectively formed within islands 20 and 30 on an underlying semiconductor substrate (not shown), with polysilicon gate electrodes 22 and 24 forming MOS structures with source regions 26a and 26b and common drain region 28 of island 20; and polysilicon gate electrodes 32 and 34 forming MOS structures with source regions 36a and 36b and common drain region 38 of island 30. For each gate electrode, a diode is also formed in the underlying semiconductor substrate spaced from the corresponding gate electrode and electrically isolated therefrom by field oxide 40. Thus, diode 42 is spaced from gate electrode 22, diode 44 from gate electrode 24, diode 46 from gate electrode 32 and diode 48 from gate electrode 34.

In each instance, one electrode of diodes 42–48 is electrically wired, respectively, to the respective nearby gate electrode through one of the subsequently formed overlying metallization layers. Such a wiring of a diode or resistor to a gate electrode through metallization layers is shown, for example, in Lukaszek U.S. Pat. No. 5,315,145. It will be readily apparent that while such a solution may be electrically satisfactory, the addition of such diodes to the illustrated integrated circuit structure of FIG. 2 spaced laterally from the MOS devices results in the use of an unacceptable additional amount of lateral space on the surface of the substrate.

It would, therefore, be desirable to provide the protection of such a diode electrically connected between a gate electrode and the underlying substrate without, however, the physical use of additional lateral space on the substrate for the location of such a protective diode.

SUMMARY OF THE INVENTION

The invention comprises an improved MOS-type integrated circuit structure, and method of making same, wherein a diode is electrically connected between the polysilicon gate electrode and the semiconductor substrate, and physically located in the substrate below the contact area of the polysilicon gate electrode so that no additional lateral space is needed to provide such a diode connection between the gate and the substrate. The junction is formed in the substrate in a region where the contact area of the gate electrode is usually positioned over field oxide, with an opening masked in the field oxide region of the substrate to provide for location of the diode therein when the field oxide is initially grown.

BRIEF DESCRIPTION OF THE DRAWINGS

FIGS. 6–12 are sequential fragmentary vertical side section views of the step by step formation of the integrated circuit structure of the invention after the initial or early stage of the structure, as shown in FIG. 5, to the final structure shown in FIGS. 3 and 4.

FIG. 13 is a flowsheet describing the process of the invention.

DETAILED DESCRIPTION OF THE INVENTION

Figure 3:
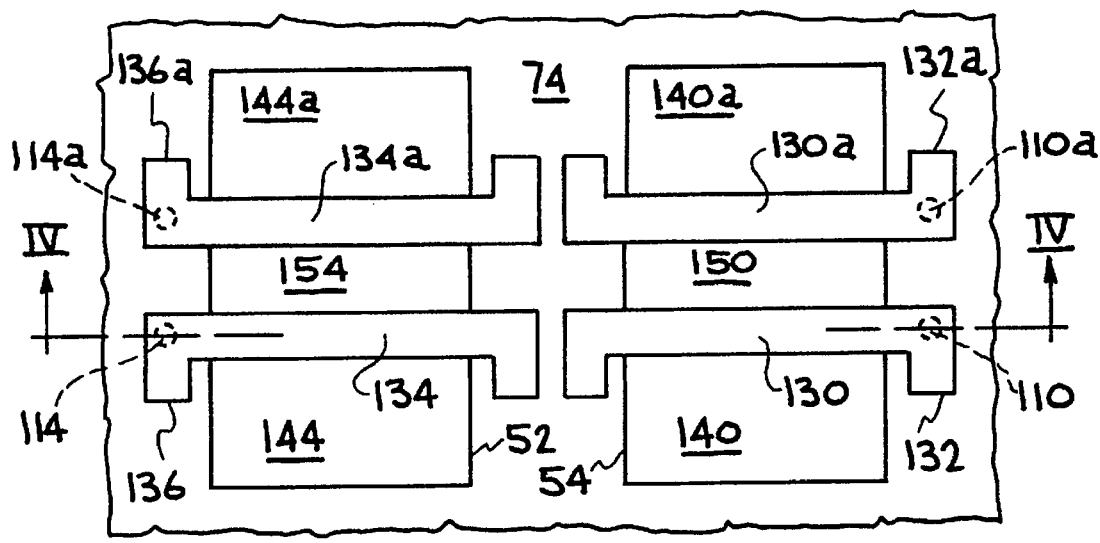
FIG. 3 is a fragmentary top view of the integrated circuit structure of the invention showing diodes located beneath polysilicon gate electrodes.
Figure 4:
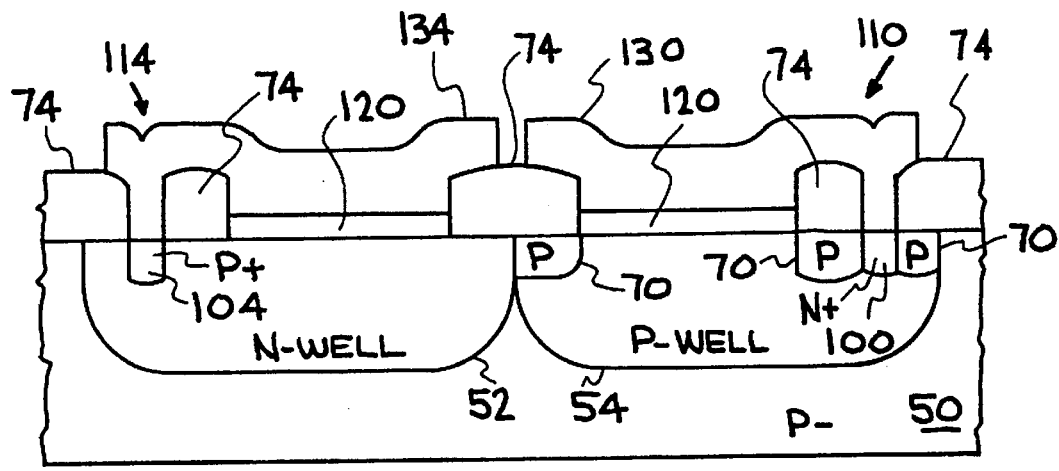
FIG. 4 is a fragmentary vertical side section view of the structure of FIG. 3 taken along lines IV—IV.
Figure 5:
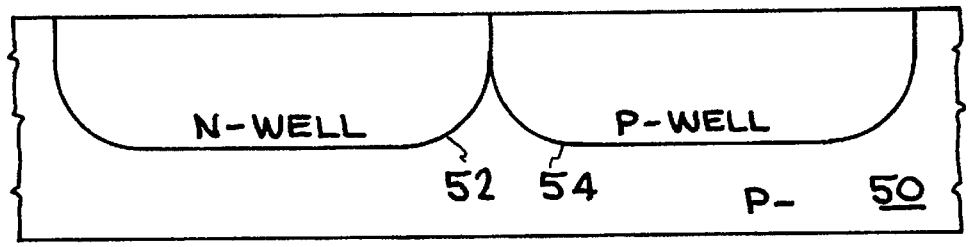
FIG. 5 is a fragmentary vertical side section view of an early stage of the construction of the integrated circuit structure of the invention shown in FIG. 4.

The structure of the invention, as shown in FIGS. 3 and 4, provides for the physical location of a protective diode beneath a polysilicon gate electrode, with one electrode of the diode electrically connected to the gate electrode and the other electrode of the diode comprising a portion of the substrate. Referring now to the Figures, FIG. 5 illustrates a typical substrate in which MOS-type devices protected by such diodes may be constructed. FIG. 5 shows a P– doped substrate 50 having an N– well 52 and a P– well 54 constructed side by side to permit construction of adjacent NMOS and PMOS transistors, i.e., a CMOS structure. It will, however, be understood that the MOS-type structure protected by a diode which comprises the invention may be formed only as a PMOS or NMOS structure and may be formed either in a P– well or an N– well, as shown in FIG. 5, or may be formed directly in an appropriately doped substrate, i.e., the structure is not limited to formation of the MOS structure in a well. However, for purposes of illustration, and not of limitation, construction of the diode-protected MOS-type structure of the invention as both NMOS and PMOS structures will be described and illustrated in the following description and drawings.

Figure 6:
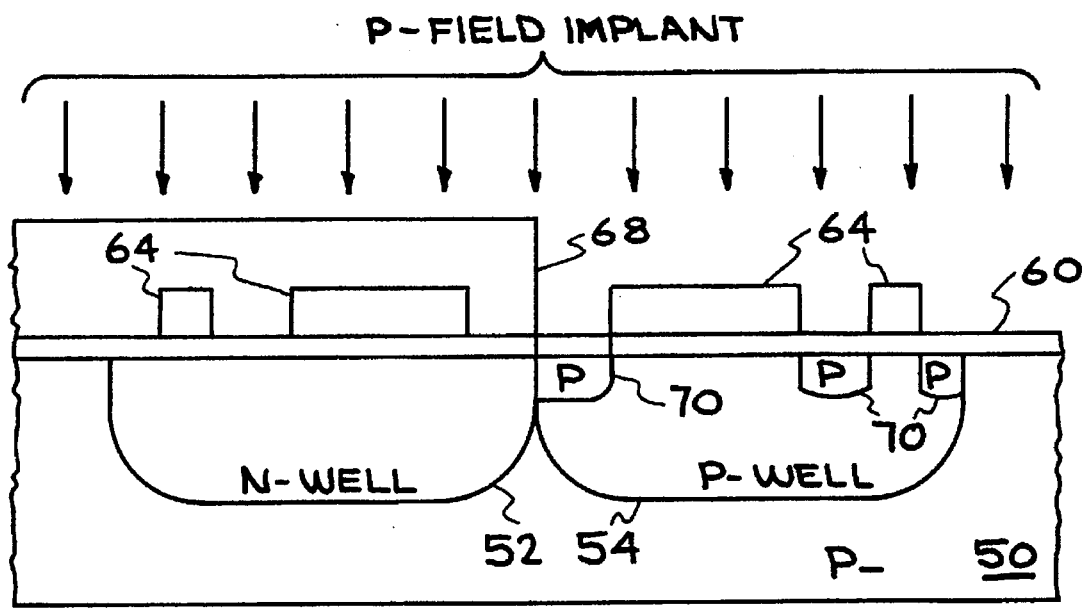

As shown in FIG. 6, substrate 50, N– well 52, and P– well 54 (which may be referred to collectively herein as the substrate structure) is masked to permit formation of the field oxide. A thin oxide layer 60 is first formed over the substrate structure followed by deposition and patterning of a nitride layer to form a nitride mask 64 thereon defining openings therein where the field oxide will be grown, with the masked portions formed over the substrate regions where the MOS structures and diodes will be respectively formed, as will be described below.

Still referring to FIG. 6, an optional P type (boron) field implant may be carried out at this stage to provide higher P type dopant concentration regions 70 beneath the field oxide which will be subsequently grown over P– well 54. The P field implant is carded out by first applying a photoresist mask 68 over N– well 52 and then implanting boron into the unmasked portions of P– well 54. While not illustrated, an N field implant may also be carried out if desired. Such an optional N field implant can be carried out, if desired, without a mask over the P field implanted areas by using a higher dosage for the P field implant than the subsequent N field implant.

Figure 7:
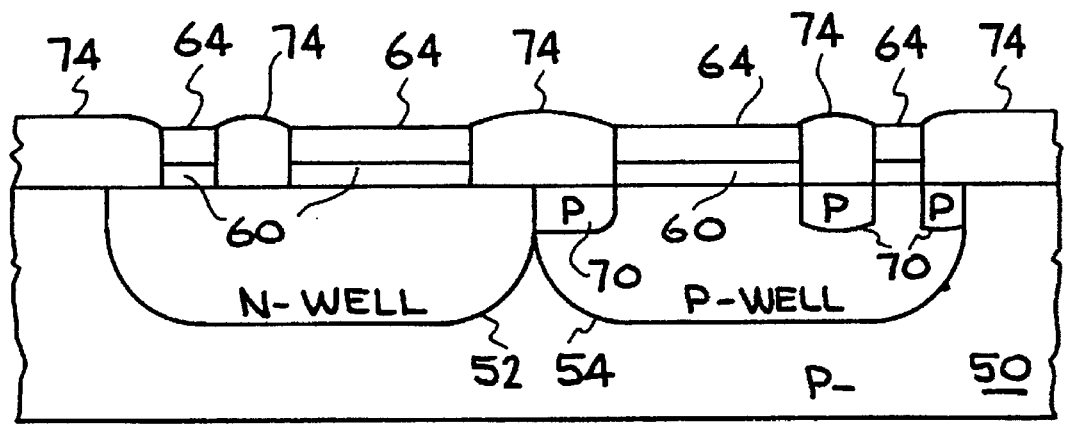
Figure 8:
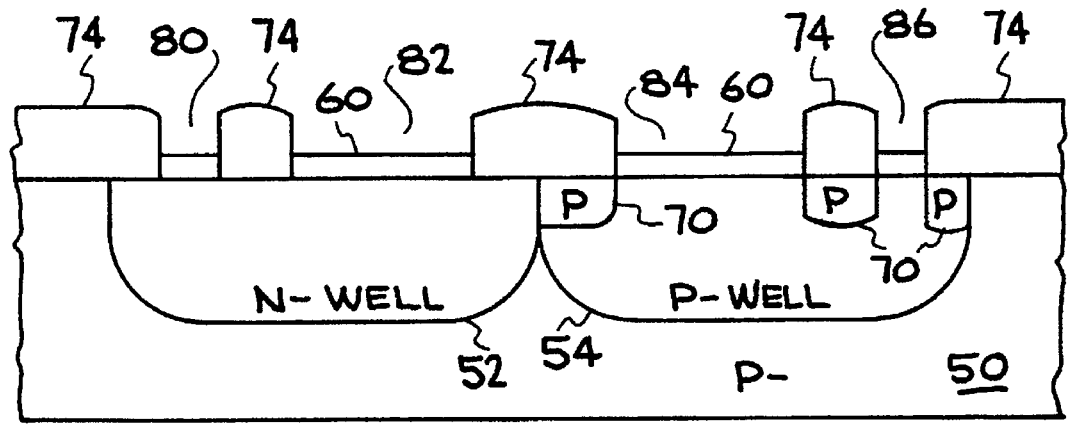

Field oxide 74 is then formed, e.g., grown, over the portions of the substrate structure exposed through nitride mask 64, as shown in FIG. 7. Nitride mask 64 is then removed, as shown in FIG. 8, providing openings 80 and 82 to expose the respective potions of N– well 52 where the respective protective diode and NMOS transistor will be formed, and openings 84 and 86 where the respective PMOS transistor and its protective diode will be formed.

Figure 9:
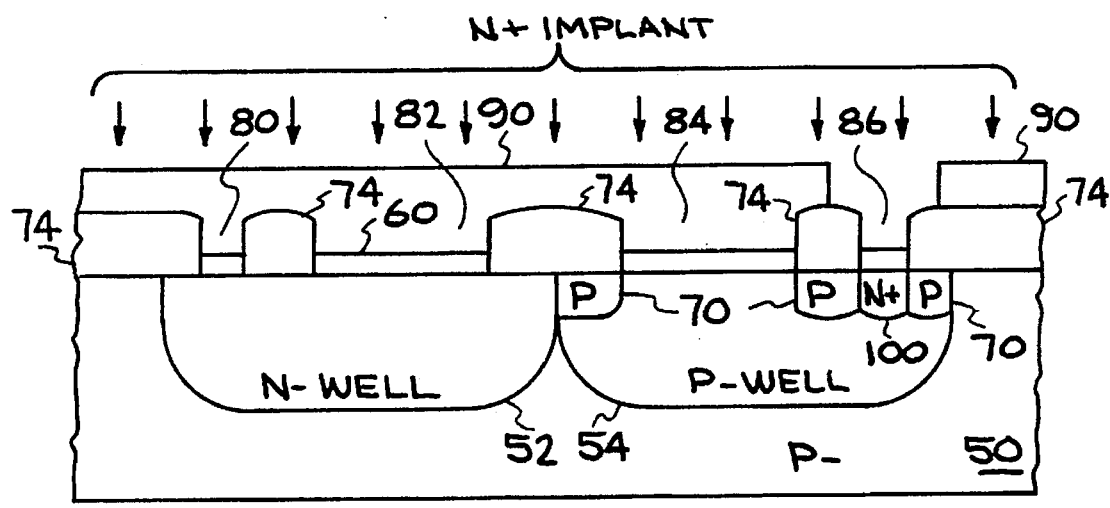

The structure is then masked, using photoresist mask 90, to expose only opening 86, as shown in FIG. 9, to permit N+ implantation of the substrate structure to form N+ region 100 which, together with P– well 54, provides a N+/P– junction comprising protective diode 110 formed in P– well 54 for the PMOS structure to be formed in and on P– well 54 portion of the substrate structure beneath opening 84. The N+ implant to form the protective diode may comprise any N-type dopant, e.g., phosphorus, arsenic, or antimony, but will usually comprise phosphorus or arsenic, or possible a combination of both, implanted to a concentration ranging from about $10^{16}$ to about $10^{21}$ atoms/cm$^3$.

Figure 10:
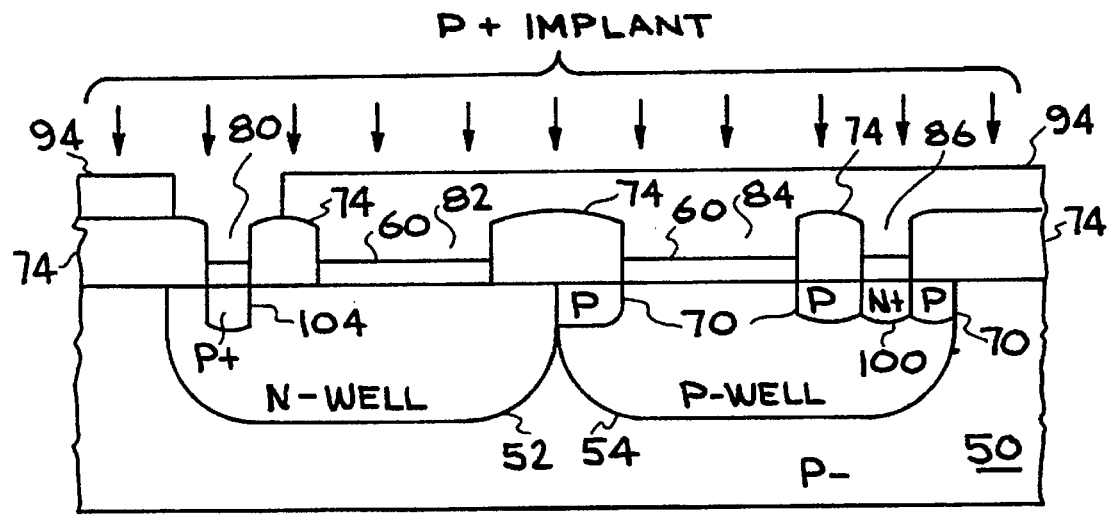

Following the formation of N+ implanted region 100 in P– well 54, mask 90 is removed and replaced by resist mask 94, as shown in FIG. 10, to permit P+ implantation of N– well 52 portion of the substrate structure through opening 80 to form P+ implanted region 104 in N– well 52 to provide the P+/N– junction comprising protective diode 114 for the NMOS structure to be constructed in and on the portion of the substrate structure defined by opening 82. This P+ implantation to form the desired P+/N– junction comprising diode 114 may be carried out by implanting boron to a concentration ranging from about $10^{16}$ to as high as about $10^{21}$ atoms/cm$^3$.

Figure 11:
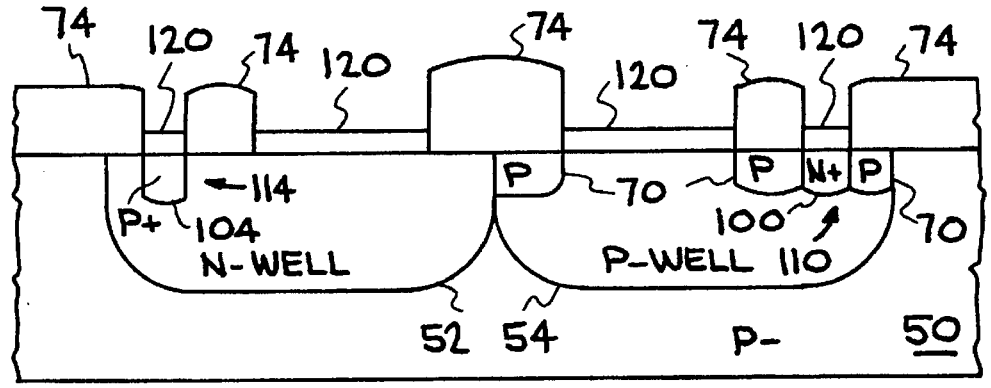

After formation of P+ region 100 and N+ region 104 in the substrate structure for the formation of respective protective dimes 110 and 114, in accordance with the invention, oxide layer 60 is removed and a gate oxide layer 120 is formed over the substrate structure, as shown in FIG. 11. The structure is then masked with resist mask 98 to permit selective removal of the portions of gate oxide layer 120 over N+ implanted region 100 and P+ implanted region 104 to permit electrical contact to be formed to diodes 110 and 114, as shown in FIG. 12.

Following the selective removal of gate oxide 120 over implanted N+ region 100 and P+ region 104, a polysilicon layer is deposited over the structure and patterned to form gate electrodes 130 and 134 respectively over and in electrical connect with diodes 110 and 114, as shown in FIGS. 3 and 4, as well as gate electrodes 130a and 134a, beneath which are shown diodes 114a and 110a.

The structure is then subjected to conventional processing to form source regions 140, 140a, 144, and 144a, and drain regions 150 and 154 by appropriately doping of those portions of P– well 54 and N– well 52 exposed by the patterning of the polysilicon layer to form gate electrodes 130 and 134 (and 130a and 134a) to thereby complete the formation of the PMOS and NMOS devices electrically connected, respectively, to diode 110 and diode 114 (and diodes 110a and 114a shown in FIG. 3).

Figure 1A:
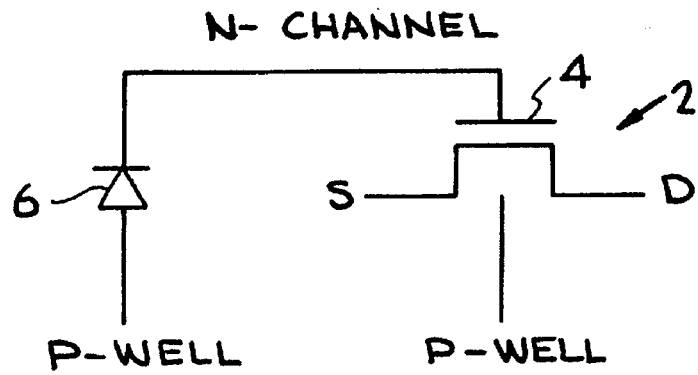
FIGS. 1A and 1B are schematic views showing the conventional (prior art) electrical circuits formed, respectively, in P channel and N channel devices having a diode electrically connected between the gate electrode and the semiconductor substrate.
Figure 1B:
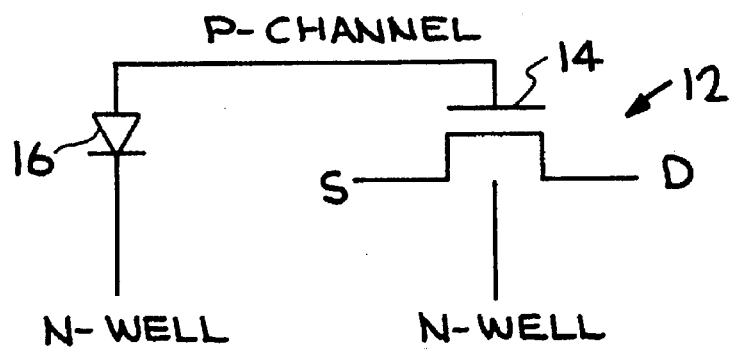
Figure 2:
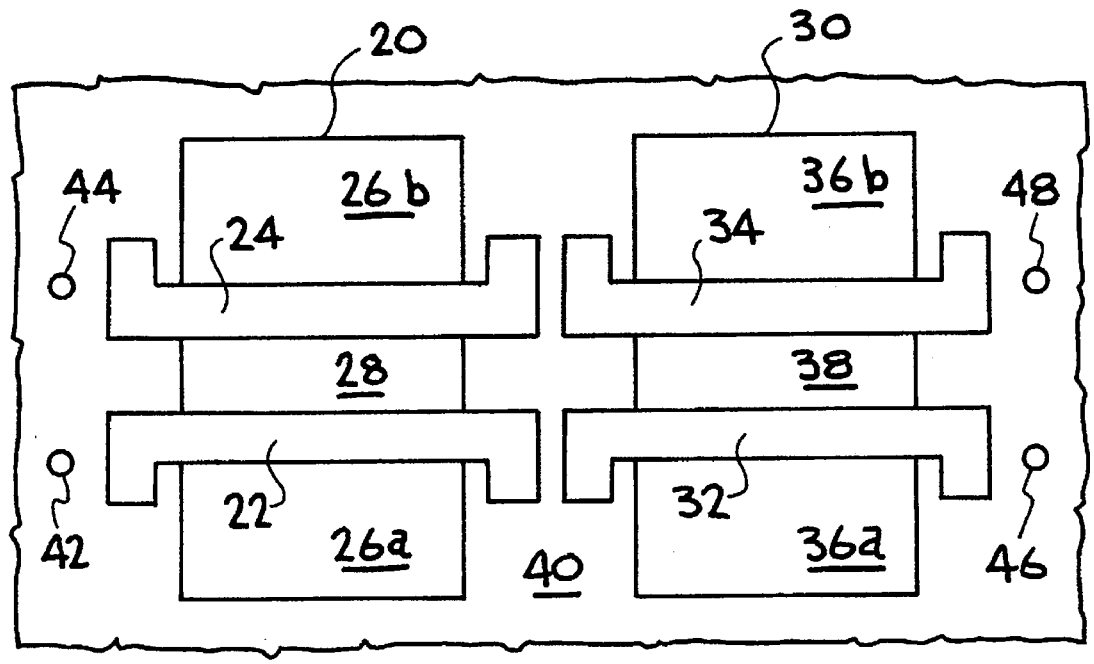
FIG. 2 is a fragmentary top view of a prior art integrated circuit structure showing the conventional location of diode protective devices located in the semiconductor substrate at a point laterally spaced from the polysilicon gate electrode.

By forming and locating diodes 110 and 114 (and diodes 110a and 114a shown in FIG. 3) respectively beneath the wide contact portions 132 of gate electrode 130, and 136 of gate electrode 134 (and diodes 110a and 114a respectively formed beneath wide contact portion 132a of gate electrode 130a, and beneath wide contact portion 136a of gate electrode 134a, as shown in FIG. 3), no additional lateral space need be provided to electrically connect the respective diodes between the gate electrodes and the substrate. Furthermore, by eliminating the prior art practice of laterally spacing the diode from the entire MOS structure, as shown in FIG. 2, and then connecting the polysilicon gate electrode to the diode through a metal interconnect, the potential problem of misregistry between the diode and the contact opening extending down to the diode from the overlying metal layer through an oxide layer is eliminated.

Having thus described the invention, what is claimed is:

1. A process for forming an MOS-type integrated circuit structure on a semiconductor substrate comprising an MOS device protected by a diode connected between said substrate and a portion of a polysilicon gate electrode of said MOS device located over adjacent isolation oxide which comprises:

a) forming a first mask on a semiconductor substrate covering:
    i) a first area of said substrate where either a PMOS or NMOS device will be formed in said substrate; and
    ii) a second area in said substrate; spaced from said first area, where a diode will be formed in said substrate;
  b) forming an isolation oxide layer over unmasked portions of said substrate;
  c) removing said first mask to expose said first and second areas of said substrate not covered by said isolation oxide layer;
  d) masking said first area of said substrate with a second mask;
  e) implanting said second area of said substrate with a dopant of opposite type to said semiconductor substrate to form a junction therein capable of functioning as a diode;
  f) removing said second mask;
  g) forming a gate oxide layer over said first and second areas of said substrate after removal of said second mask;
  h) masking said first area with a third mask;
  i) removing those portions of said gate oxide layer formed over said second area of said substrate;
  j) forming a polysilicon gate electrode:
    1) over said gate oxide formed over said first area of said substrate;
    2) over said second area of said substrate to thereby permit electrical contact between said gate electrode and said diode formed under said gate electrode in said second area of said substrate; and
    3) over portions of said isolation layer surrounding said second area and adjacent said first area; and
  k) then forming source and drain regions in portions of said first area of said substrate not covered by said gate oxide and said polysilicon gate electrode.

\* \* \* \* \*